United States Patent
Noble

Patent Number: 5,892,949
Date of Patent: Apr. 6, 1999

[54] ATE TEST PROGRAMMING ARCHITECTURE

[75] Inventor: Alan C. Noble, Santa Cruz, Calif.

[73] Assignee: Schlumberger Technologies, Inc., San Jose, Calif.

[21] Appl. No.: 705,795

[22] Filed: Aug. 30, 1996

[51] Int. Cl.[6] .................................................. G06F 11/30
[52] U.S. Cl. .......................................................... 395/704
[58] Field of Search ........................ 395/183.07, 183.14, 395/183.22, 704, 682, 683, 183.06

[56] References Cited

U.S. PATENT DOCUMENTS

| | | | |
|---|---|---|---|
| 5,233,611 | 8/1993 | Triantafyllos | 395/183.22 |
| 5,371,883 | 12/1994 | Gross et al. | 395/183.14 |
| 5,475,843 | 12/1995 | Halviatti et al. | 395/704 |
| 5,475,845 | 12/1995 | Orton et al. | 395/682 |
| 5,600,789 | 2/1997 | Parker et al. | 395/183.14 |

*Primary Examiner*—James P. Trammell
*Assistant Examiner*—Matthew Smithers
*Attorney, Agent, or Firm*—Fish & Richardson P.C.

[57] ABSTRACT

A test programming architecture provides an application development and execution framework for the development and execution of test programs for a programmable tester for circuits, including a view class library encapsulating objects of a windowing system, one or more tools having view objects for interacting with a user, a visual interface class library framework providing common tool functionality by defining behavior common to tools in a superclass for individual tools, a persistent object environment manager (POEM), an object database accessible to the POEM module for database transactions, and an object request broker providing communication among view objects in tools, test objects in POEM, and a test program running on the tester.

27 Claims, 3 Drawing Sheets

ATE TEST PROGRAMMING ARCHITECTURE

CROSS REFERENCE TO RELATED APPLICATIONS

Under 35 USC § 119(e), this application claims the benefit of prior U.S. application Ser. No. 60/003,010, filed Aug. 31, 1995.

BACKGROUND OF THE INVENTION

The present invention relates to a software architecture and framework for the development and execution of test programs for automatic test equipment for testing circuits, such as integrated circuits or circuit boards. More particularly, the present invention relates to a distributed object-oriented architecture, and more particularly, to one capable of integrating new, object-oriented programming into a legacy program environment.

Automatic test equipment for testing electronic circuits ("ATE testers" or "testers") normally operate under control of a program loaded in the tester itself and executing on the tester hardware, which generally includes an embedded processor (such as a workstation-class microprocessor), referred to as a CPU, that performs higher-level data management and control functions for the tester. Test programs on a tester for testing large and complex circuits generally are large and complex, require extensive development and debugging effort by numerous test design engineers, and have to be developed quickly and accurately to meet rapid development times for prototype and production circuits. The program development and execution environment for ATE test programs play an important role in the success of these efforts.

Testers have evolved over the years, and many carry the benefit of substantial investments in test programs and programming environments. Software for such legacy systems cannot simply be replaced by new programming technology because it embodies capabilities that would take a large engineering effort to duplicate in its entirety. On the other hand, legacy systems, being based on old technologies, will tend to fail to meet current expectations for performance, features, ease of use, stability, and reliability.

Thus, there is a need for an architecture and framework for the development and execution of test programs that will meet current demands for power, features, ease of use, stability, and reliability. There is a further need for such an architecture that is can be made compatible with legacy tester programming and execution environments.

SUMMARY OF THE INVENTION

In general, in one aspect, the invention provides an architecture and framework for the development and execution of tester programs for ATE testers (more briefly, a Test Programming Architecture or "TPA"). TPA has a framework providing common interface tool functionality, a model-view-controller architecture providing user interface views in user tools, runtime views in a runtime module executable in the tester, model functionality in a persistent object environment manager linking interface views and runtime views to test objects derived from persistent objects in an object database accessible to the environment manager, and controller functionality in user tools and runtime modules. TPA has an object request broker to provide communication among view objects in tools, test objects in the environment manager, and a test program loaded in the tester. In another aspect, TPA provides an adapter module executable in the tester to provide interface services between the environment manager and a test program loaded in the tester, the adapter module having an interface for invocation through the object request broker and being executable to appear as a view to the environment manager. In another aspect, TPA provides a legacy interface module executable in the tester to provide interface services outside the object request broker between legacy tools and a test program loaded in the tester.

In another aspect, TPA directly couples a runtime module in the tester to the object database to allow efficient direct communication of database objects to the tester.

In general, in another aspect, TPA provides a view class library encapsulating objects of a windowing system, a visual interface class library framework providing common tool functionality by defining behavior common to tools in a superclass for individual tools, an object runtime adapter module that can be invoked through the object request broker and that is executable in the tester to provide interface services between the environment manager and a test program in the tester, and a legacy interface module executable in the tester to provide interface services outside the object request broker between user tools and a test program in the tester. In another aspect, the environment module is a daemon process and creates synthetic test objects from persistent test objects in the database.

In general, in another aspect, the invention provides a system for the development and execution of test programs on a programmable tester for circuits. The system includes a programmable tester; a first computer; one or more graphical user interface (GUI) object-orient programming (OOP) applications (tools) running on the first computer for use by a user, tools having view objects providing views to the user; a second computer coupled to an object database; a persistent object environment manager (POEM) running on the second computer, POEM having test objects encapsulating test program behavior and data and using the object database to store test objects; a third computer; an object request broker (ORB) running on the third computer, ORB providing data synchronization between view objects in tools and test objects in POEM; and an runtime view interface module programming the tester to appear as a view to POEM.

In another aspect, the system includes a data path directly coupling the tester to the database; and a data interface module programming the tester for loading components of the test program from the object database through the data path. In another aspect, the system includes a legacy interface for communicating directly with tools running on the first computer. In another aspect, the embedded computer, the second computer, and the third computer are the same computer or different computers. In another aspect, the second computer coupled to the third computer by a network.

The Test Programming Architecture has a number of advantages.

For example, unmodified "legacy" tools can coexist and be used along with newly developed tools, and existing user source code programs can be imported and used without alteration, all without compromising the performance of the resulting test program.

Also, the structure of the new architecture and framework allow a transition to remove the legacy programming environment to be made with minimal changes to the new system.

Also, a conventional object-oriented database (or alternatively, a relational database) can be used as a persistence mechanism for objects, resulting in advantages including greater reliability and lower cost.

Also, the ability to distribute the storage, use, and execution of objects allows provides flexibility in the development and debugging of test programs.

Also, the architecture provides for test program execution to be the same during development as during production.

Also, the architecture provides a reduction in the time to develop and debug test programs and in the amount of code test program development engineers are required to write as well as the time required to extend a test program environment.

Also, the architecture supports development and debugging by multiple users working on different parts of the same test program in parallel, and by users working remotely and on multiple hosts.

Also, changes made to a loaded test program (that is, a test program loaded into a tester) in the tester may be propagated to persistent objects. In addition, changes made directly to the loaded test program through legacy functions may be captured into objects by first writing out a source code file from the tester and then compiling or parsing it. Also, a legacy program can conveniently be converted to the new architecture.

For a fuller understanding of the nature and further advantages of the invention, reference should be made to the detailed description taken in conjunction with the accompanying drawings.

DETAILED DESCRIPTION

Figure 1:
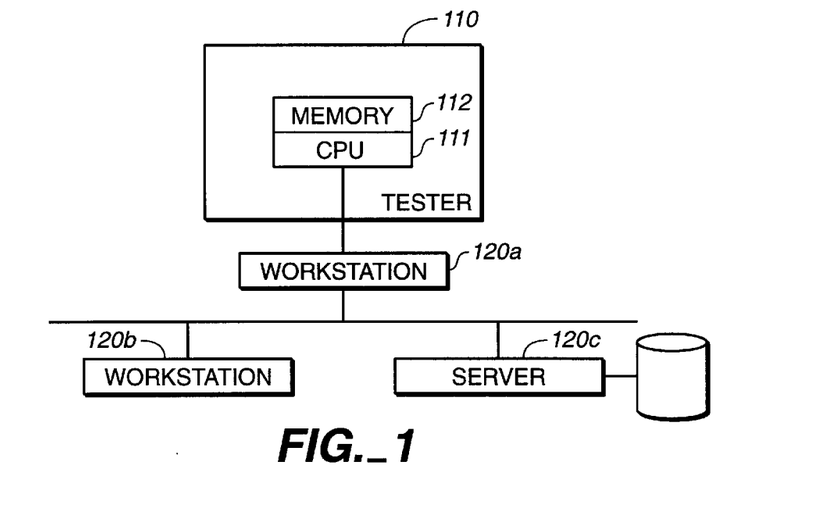
FIG. 1 is a block diagram illustrating a test hardware environment.

Turning to FIG. 1, a tester 110 operates under software control, including under the control of a CPU 111 executing a test program stored in a random access memory 112. The CPU 111 may communicate with, and operate under control of, a computer, such as a single-user workstation 120a, connected by a bus or by a network connection, such as an Ethernet connection. The tester 110 may also be connected to other computers 120b, 120c on a network, including a server 120c for storing test programs.

Figure 2:
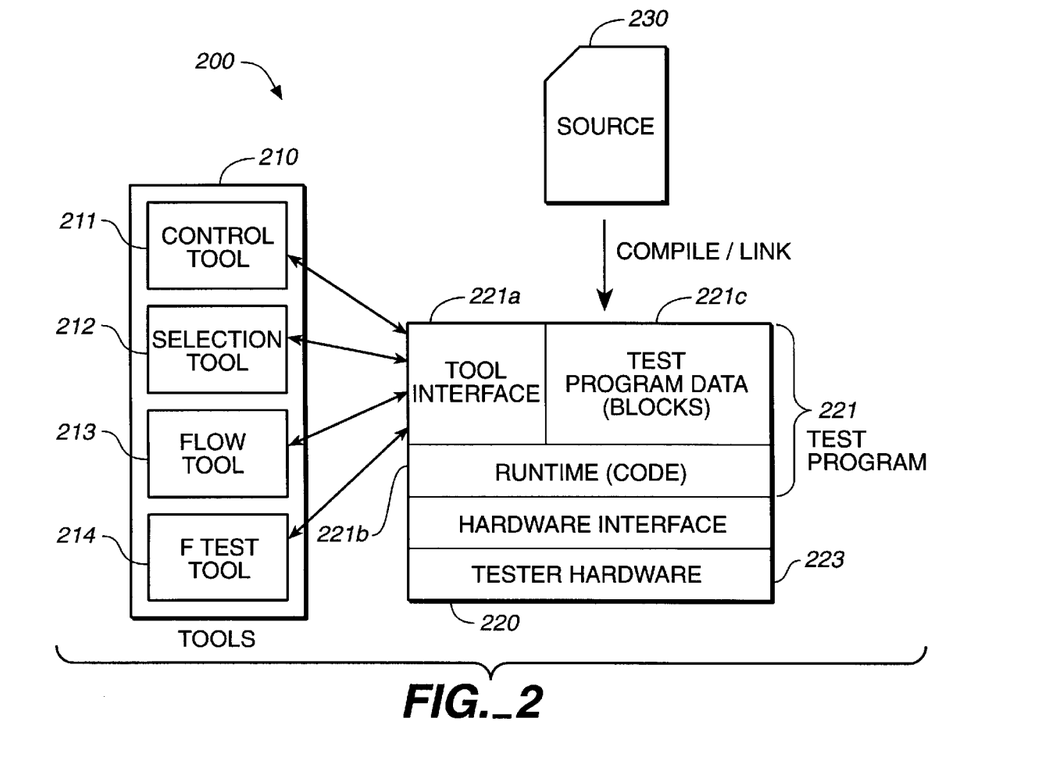
FIG. 2 is a block diagram illustrating a prior art ATE test programming architecture.

Turning to FIG. 2, the architectural components of a legacy software tester architecture 200 include a user interface that provides the user (not shown) a number of tools (graphical user interface applications) 210 for managing and running test program components. (A test program should be understood to include test vector execution as well as flow and setup information.)

The tools include, for example, a ControlTool 211, which initializes the user interface and starts up tools requested (directly or indirectly) by the user; a SelectionTool 212, which allows the user to select a test program from a program database (not shown); a Flow Tool 213, which allows the user to specify a sequence of tests and gives an overview of a complete test program; and an FTest (functional test) Tool 214, which allows the user to select timing, patterns (collection of vectors), and levels of functional tests.

The user interface tools 210 of the illustrated legacy system 200 communicate point-to-point with a tool interface 221a, a software module running in the tester 220, thus providing a single-user environment. In the tester 220, in addition to the tool interface 221a, the test program 221 has two principal parts: (1) the runtime 221b, which includes test program code for interpreting test program data 221c loaded as blocks, and for running the tester hardware 223; and (2) the test program blocks 221c, which will differ from one test program to another. The test program blocks 221c are compatible with the test programs. For example, if the test programs are written in the programming language C, the test program blocks 221c are loaded as C data structures, derived from source code 230 by the processes of compilation and linking.

Architectural Overview

Figure 3:
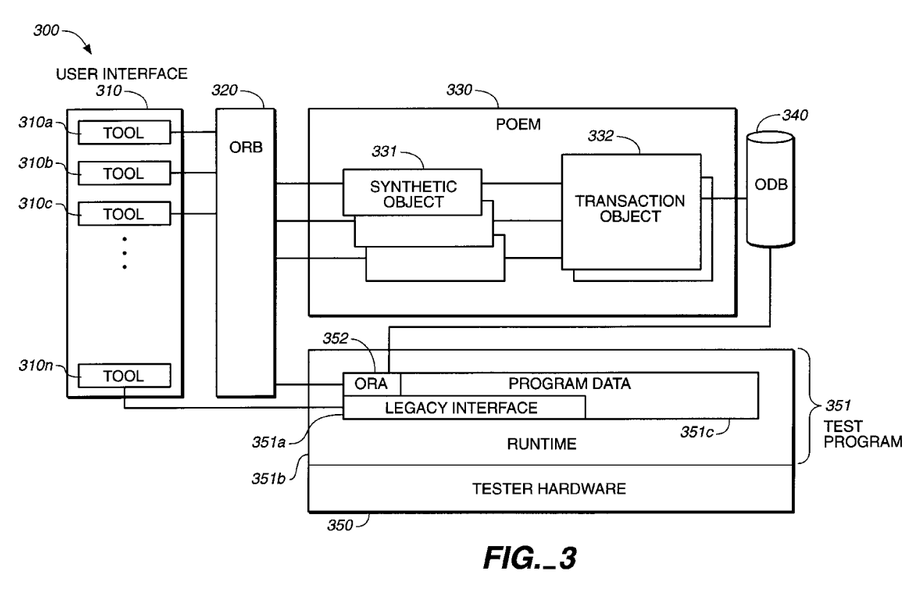
FIG. 3 is a block diagram of a test programming architecture.

Turning to FIG. 3, a test programming architecture (TPA) 300 has three fundamental components: (1) a user interface 310 for a user to use in creating, editing, and debugging objects; (2) test objects, which are the basic building blocks making up a test program (itself an object) and which implement domain logic (behavior) and data storage, along with supporting object management components 330, 340; and (3) a test program runtime that implements object execution and hardware control.

One or more users (not shown) may access a system implementing TPA to develop and execute test programs by using tools. Tools communicate through an Object Request Broker (ORB) 320 to objects that make up the test program. These objects are stored as persistent objects in an object database (ODB) 340. However, because persistent objects, by definition, are only accessible during database transactions, "synthetic" objects 331 corresponding to test objects in the test program are created in transient memory in POEM 330 (described below). It is the synthetic objects 331 that are referenced (through ORB 320) by the tools in the user interface 310. Synthetic objects 331 are responsible for pulling persistent objects from the ODB 340 and manipulating them. This may be done by copying persistent objects to create "transaction" objects 332 in the local address space. Thus, tools manage the persistent objects in the ODB 340 through the synthetic objects 331 and their corresponding transaction objects 332.

When changed, a synthetic object 331 opens a transaction, references the persistent object (which loads the object as a transaction object 332 into the same address space), and then changes the transaction object 332. When the change transaction ends, the transaction object 332 is written to the ODB 340. Note that each synthetic object 331 may have its own transaction update strategy, for example, caching multiple changes into one database transaction.

When a user selects a test program, a Persistent Object Environment Manager (POEM) 330 causes synthetic objects 331 for the test program to be created and loaded into memory as required. POEM 330 need not do this directly; rather, it may create and load a synthetic test program object 331, which may create and load synthetic objects 331 for all of its components. Where there are multiple simultaneous users, each user has one POEM 330, implementing all the user's test objects. The architecture 300 permits multiple users to share one POEM, which would be useful where multiple users debug the same program.

In addition, when a test program 351 is first loaded for use in a tester with legacy tester programming, there is an Object Runtime Adapter (ORA) 352 (described in greater detail below) to which is passed an object reference to the corresponding synthetic test program object in POEM 330. ORA 352 then uses this reference to register itself with all of the synthetic objects 331 created for the test program 351. ORA 352 registers with each synthetic object 331 as a view (in the model-view-controller sense, as described below) so that it is notified regarding any changes in the synthetic objects 331 and can update the program data blocks 351c in the loaded test program 351 accordingly. Before a test program executes, ORA 352 fetches the contents of the synthetic test program object's test objects from the ODB 340 and maps them into legacy data structures in the loaded test program data 351c. As changes are made to the synthetic objects 331, ORA 352 is notified and replaces the contents in the loaded test program data 351c with the new versions.

Conversely, if blocks 351c of the loaded test program are updated during execution by the test program itself or through the legacy interface 351a to user interface tools 310, ORA 352 is notified and propagates the changes to the appropriate synthetic objects 331.

ORB 320 is a CORBA-compliant object request broker, that is, it complies with the Common Object Request Broker Architecture and Specification promulgated by the Object Management Group. One such object request broker is Orbix object request broker, which is available from Iona Technologies of Dublin, Ireland.

In an alternative embodiment where backward compatibility for legacy programming is not required, ORA 352 is not required and POEM 330 becomes the test program in the tester, obtaining and executing test objects directly from the ODB.

Model-View-Controller Interaction

Figure 4:
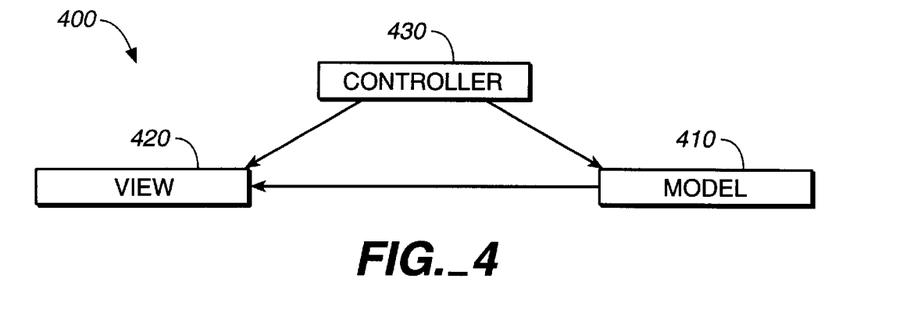
FIG. 4 is a block diagram illustrating the model-view-controller relationship.

Turning to FIG. 4, in a model-view-controller (MVC) architecture, the model 410 is a fundamental data element from the problem domain. The view 420 represents the display of the data, and the controller 430 receives commands to change either the view 420 or the model 410. The commands are then passed (as messages) to either the model 410 or the view 420, sometimes after requesting additional information from the user.

In a simple example, the model 410 is a text string such as the name of a DC test, the view 420 is a window displaying the text string, and the controller 430 responds to various requests relative to either. If the user enters a command "reverse display", the view 420 displays the string backwards (e.g., the string "open" is displayed as "nepo"). If the user enters a command to change the string, the user would be prompted (by the controller 430) for a new string. This string would then be passed to the model 410 as part of a "change yourself" message.

The view 420 is responsible for all updating of the display, so the view 420 updates itself with information provided by the model 410. However, to know when to update itself, the view 420 "registers" with the model 410. Thus, when the model 410 is updated, it can notify the view 420 that it has been changed. Then, the view 420 can ask for the updated information and update the display.

Multiple views 420 may display data from the same test object. Since there is always one controller 430 per view 420, multiple views implies multiple controllers. When one of the controllers 430 updates the model 410, the model 410 notifies all views 420 that are registered with it. Also, where a view 420 has logical subcomponents, a hierarchy of views may exist.

Figure 5:
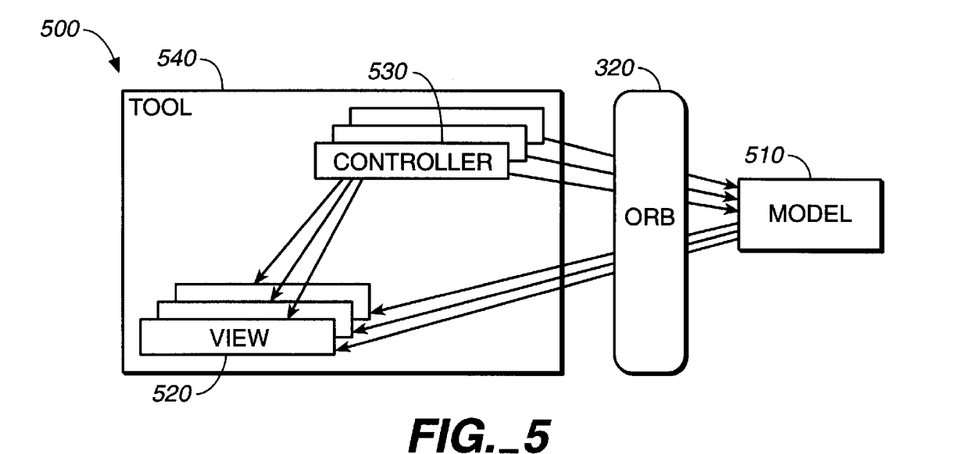
FIG. 5 is a block diagram illustrating a model registered to multiple views and controllers in a tool.

Turning to FIG. 5, in TPA 500, the model 510 is a synthetic object, which may exist remotely from the controllers 530 and views 520 that are accessing the synthetic object. As has been mentioned, test objects are the basic building blocks of a test program, which itself is an object. Each test object encapsulates the data and operations associated with a particular kind of test or test setup. For example, an ftest object is responsible for a particular functional test, and a levels object is responsible for setting up levels in the tester. Services provided by each object are specified in Interface Definition Language (IDL), as defined by the CORBA specification.

On the user interface side, a tool 540 is responsible for viewing or editing a particular test object. For example, FTest Tool is responsible for interfacing to ftest objects. An attach mechanism associates views 520 of a tool 540 with the synthetic test object that the tool 540 is using, i.e., creating, editing, or viewing. An update mechanism automatically propagates changes made to the model 510 by one view 520 to dependent views using the attach mechanism. Returning to FIG. 3, runtime 351b also operates as a view, although not in the conventional sense: the runtime view transforms the current state of the model 510 into hardware executable data.

Figure 6:
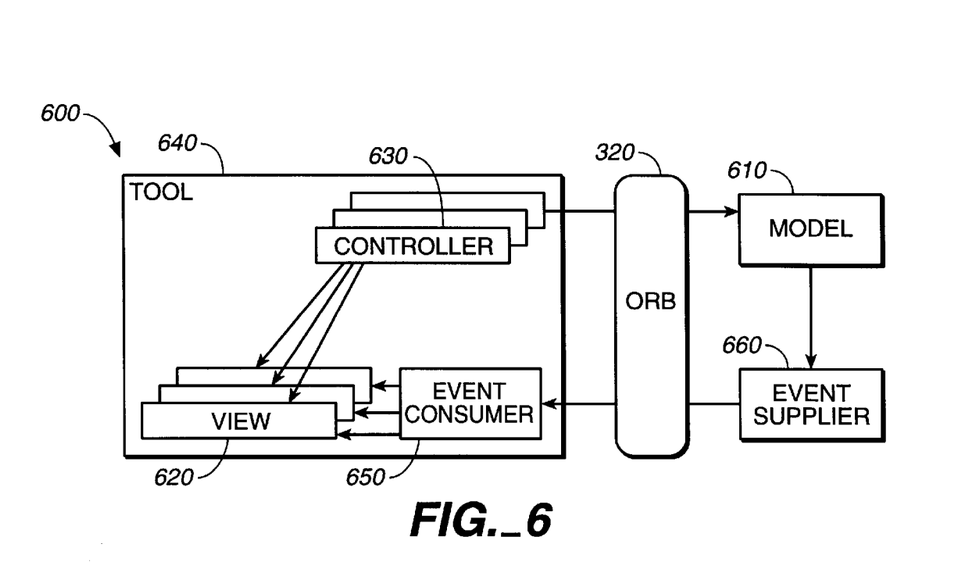
FIG. 6 is a block diagram illustrating an event consumer and an event supplier in conjunction with a model and a tool having multiple views and controllers.

Turning to FIG. 6, TPA 600 uses an event mechanism to create a distributed model-view-controller architecture across ORB 320, which could be used to distribute the architecture across a network, such as an Ethernet local area network or a wide area network. When a tool 640 is first invoked, it creates an event consumer 650. Each view 620 in the tool 640 registers with the event consumer 650 for the events it needs to know about. The event consumer 650, in turn, registers with an event supplier 660 to be notified of changes. POEM 330 has an event supplier; ORA 352 has an event supplier and an event consumer; and each tool has an event consumer, which is provided by VITAL (described below). When, for example, an event occurs to the model 610, the model 610 notifies the POEM event supplier 660 and the event supplier 660 notifies each event consumer 650 registered for the event that the event has occurred. The event consumer 650 then notifies each view 620 registered for that event.

When multiple views 620 of a tool 640 register for the same event with the event consumer 650, only one notification is required for the event consumer 650, which will notify all of the views 620 registered with it.

Events have associated types. With multiple types, each event consumer 650 need only register with the event supplier 660 for the event types it is interested in, specifically, event types that one of its views 620 has expressed interest in. If no views 620 for tool 640 have expressed interest in an event, then the tool's event consumer 650 would not be registered to receive notification of the event from the model 610. Thus, for a given event, only the event consumers 660 that have registered interest in its event type will be notified.

Another aspect of event registration and notification is that the event consumer 650 need only register with the event supplier 660 for the first event of each type. If additional views 620 register for the same event type, the event supplier 660 will already know to notify the event consumer 650. Conversely, the event consumer 650 will not "deregister" with the event supplier 660 until the last view 620 has "deregistered" with the event consumer 650.

For each tool, one must choose an appropriate granularity for the MVC triad. For example, it is possible to have the entire drawing area for a tool be one view, which corresponds to a single test object. If this were the case, any change to the test object would send a notification to all registered views. Each view would then need to fetch all of the information for the test object to see what had changed and update itself accordingly. For complex test objects, a view might only be displaying a small portion of the information, but would nevertheless be required to fetch all of it for every change. Furthermore, a view displaying all of an object view would be required to fetch all of the contents to determine which portion had changed.

To avoid the problem of coarse grained objects, objects may be decomposed into subobjects (which are objects in their own right) and corresponding views created for those objects. With this approach, a tool would have an overall view and then subviews for each of its fields. When one of these components is updated, only the subviews are notified. This reduces the message traffic for each update; however, it adds to the complexity of both the model and the tools that access the model. Because each model is now composed of many (possibly hundreds) of submodels, there must be a view for each of these in the tool, which could require significant overhead upon tool start-up (or whenever a new model is opened).

As an alternative to object decomposition, TPA allows a rich set of event types to be defined, so that the model can choose an appropriately specific event type for each update. For example, a model could be defined with five or six events (such as timingUpdatedEvent) and then send the appropriate notification to the views registered for that specific event. When the view in the tool receives notification (e.g., timingUpdatedEvent), the view knows it only needs to fetch, e.g., timing information, and not all of the other information for the model. Thus, one need not create numerous, very tiny views, nor does one incur excessive communication between the tool and the test object.

Inter-User Event Notification

In addition to the event notification mechanisms described above, TPA optionally provides an inter-user event notification mechanism to allow two or more users who are viewing the same object to be aware of each others' activities. Consider the following scenario:

User 1 opens an Ftest object.

User 2 opens the same Ftest object.

User 1 makes some modifications and then closes the new version.

At this point, User 2 is unaware that he is looking at an object that is out of date. This may or may not matter to the user, but the system cannot make that determination. The inter-user event notification mechanism informs each synthetic object registered on a persistent object whenever a new version of the persistent object becomes visible. The synthetic object may then decide whether or not to notify the tools that have the superseded object open. When notified, the tool may alert the user and allow the user to decide whether or not to obtain a new copy.

The mechanism to provide this notification is called Database Event Notification Server (DENS). Whenever a synthetic object is opened, it registers with DENS that it is interested in its corresponding persistent object. When a user changes a persistent object, the user's synthetic object notifies DENS by asking the ODB for the previous version of the object. This previous version is converted to an object reference and passed to DENS. DENS notifies any synthetic objects that have registered an interest in this superseded object that it has been updated and that the updated object is now visible. The notified synthetic object is responsible for notifying the user, who can elect to continue working with the older version or to update the object and work with the newer version. In either case, if the user closes and then opens the object again, the user will get the new version.

Object Runtime Adapter/Test Program

Turning to FIG. 3, ORA 352 manages the interface between synthetic objects 331 and the actual test program 351 loaded in the tester 350. ORA 352 is a CORBA server and consequently can be invoked through ORB 320 by a tool. For example, ControlTool loads the test program, at which time ORA 352 opens the ODB 340 through the database management system of the ODB 340 and locates the test program. A suitable database management system for the ODB 340 is ObjectStore, which is available from Object Design, Inc. of Boston, Mass.

ORA 352 begins a database transaction, fetches all of the objects that are part of the requested test program, and translates them to appropriate data structures (for example, for compatibility with a legacy test system that expects C structures, ORA 352 translates to C data structures), and loads them into memory in the tester.

ORA 352 also creates the event suppliers 660 and event consumers 650 that have been described. When ORA 352 is invoked, it is passed a reference to the synthetic test program object 331 in POEM 330 and ORA 352 registers for the events it is interested in from the test program.

Once this has been completed, any tool may be brought up to query the test program and display the information returned.

The ORA event consumer also registers with the event supplier of the test program for all events in which ORA 352 is interested. These will include any event that updates or executes objects.

Whenever the test program 351 or any synthetic object 331 is changed, a change event is generated. A test program change event is generated by the ORA event supplier; a synthetic object change event is generated by POEM. In any case, any event consumer registered for the event is notified.

The ORA 352 views are not real views in the sense that they display anything; they are notified of updates so that the new information can be mapped into the test program 351 in the tester. Whenever an ORA view receives an event, ORA 352 first queries the synthetic object 331 that sent the event, gets the data, and then translates it to a C (or other compatible) structure for the legacy system and calls appropriate runtime routines, if necessary.

Whenever an execute event is generated, either by a tool or by POEM 330, ORA 352 receives the event and calls a runtime execute command. When runtime 351b completes the test, ORA 352 collects the result, saves it to the ODB 340, and generates an execute done event. Tools that receive the execute done event may then retrieve and display the result.

Legacy Source Code

Test programs may exist in four forms: as legacy source code, as compiled legacy source code (object code modules), as test objects, either persistent or synthetic, and as mapped into legacy data structures in the tester. The legacy architecture allows users to use tools to modify parts of a test program and then capture the modifications by generating source code for the affected parts of the program, which source code could be modified off line using, for example, a text editor.

Thus, for compatibility, TPA provides for generation of source code files for test program modules from synthetic objects, converting the data to the appropriate source code, and writing it to a file.

The converse process, generation of test programs from legacy source code is more complex, because there are two cases in which the system may be asked to read source code files: (1) converting existing programs to TPA, and (2) modifying TPA programs using an editor and the legacy source code compiler. For the first case, the entire source code file can be read and converted to new test objects.

However, in the second case, a user may have generated a source code file from an existing test program, edited it using a text editor, and then converted that back to a test program. Because others may be working on different parts of the test program at the same time, it would not be desirable for a completely new test program to be created if the user does this. Rather, the system replaces the objects that were changed with new versions and leaves the remainder of the test program unchanged. (To replace unchanged program objects could result in spurious update notification being given to other users. See discussion of DENS, above.)

Thus, TPA includes a conversion utility to read a source code file and create each object represented in the source code file. Each object is compared with the corresponding object in the test program. If one exists and is different, a new version is created. If it is new, a new object is created in the ODB.

Responsibilities of Architectural Components

The responsibilities of the architectural components, namely tools, synthetic objects, POEM, ORA, and persistent objects, will now be described.

ControlTool

ControlTool performs the following tasks. It:

requests a list of available test programs (for display in SelectionTool);

sends POEM an "open" or "select" message to establish a connection to the test program (to get a reference to a synthetic object);

displays a list of available tools to the user;

opens tools selected by the user, and passes the object reference of the synthetic test program object to the newly loaded tool;

loads the test program onto the tester;

invokes ORA, which is part of the test program, passing it the object reference to the synthetic test program object;

notifies any open tools that they must close if the user selects "exit", and waits for them to close; and notifies POEM that ControlTool is exiting and is no longer interested in the synthetic test program object when all children tools have closed.

Individual Tools

Individual tools are invoked by ControlTool and child tools at the request of the user. Each tool performs the following tasks, as necessary for its function:

creates all necessary local controllers and views for the specific type of object;

creates an event consumer for every synthetic object that will notify the tool about changes;

sends a message to the synthetic test program object to get a list of objects of a given type;

displays the list of objects to the user and allows the user to select one;

sends a message to the synthetic test program to open the selected object; and passes the object reference (of the selected object) that was returned to the event consumer.

All common tool functionality is handled for VITAL framework (which is described below).

POEM

POEM runs as a daemon.

When ControlTool first comes up, a master POEM daemon, running as a privileged super user, is spawned (unless it is already running). When a user first comes up, the master POEM daemon clones itself as a user POEM daemon for the user with the user's identity. In this way, a POEM is always there as a server for requests, and the user's POEM can be created quickly.

When a user selects a test program, the user's POEM:

opens a transaction; searches the database for the requested test program;

gets a pointer to the persistent test program object;

creates a synthetic test program object (passing it the pointer of the persistent test program);

initializes the test program (this is done after ORA is started so that ORA is registered to receive events about the creation of test program components as they are read from persistent storage into synthetic storage);

closes the transaction; and returns the object reference of the synthetic test program object to ControlTool.

Also, when ControlTool exits, the user POEM:

destroys the synthetic test program object; and terminates if there are no more ControlTools accessing this POEM for this user. The master POEM, however, continues to run.

Synthetic Test Program Object

The synthetic test program object is created by, and resides in, POEM and exists for as long as any of its components is being accessed. When it is created, the synthetic test program object initializes itself by database transactions as described above.

Upon demand, the synthetic test program object:

creates synthetic subobjects, which in turn initialize themselves as described above;

returns lists of objects of a given type;

returns the object reference to a synthetic object, given the name of the object and its type;

creates new synthetic objects by verifying that the test program is in a state where it can be modified, creating a new synthetic object (and passing it its name), notifying registered objects of the existence of the new object (passing the object reference as part of the event), and returning the object reference to the new object; and deletes objects by verifying that the test program is in a state where it can be modified, deleting the object, and notifying registered objects of the deletion.

Synthetic Objects

Synthetic objects are created by the synthetic test program object, upon demand. Each synthetic object (other than the synthetic test program object) will:

create itself (given its name) by initializing appropriate storage and creating a persistent object corresponding to the synthetic object;

modify itself by opening a transaction to access the corresponding persistent object(s), changing the data in both the persistent object and the synthetic object, and ending the transaction; and return information by accessing the appropriate information in the synthetic object or obtaining it from the persistent object and returning it to the caller.

Each synthetic object, including synthetic test program objects, will:

generate a "modify" event when they are changed (including destruction);

for a synthetic object with execution semantics such as DC test, execute itself by means of an execution operation, which results in the generation of an "execute" event;

save itself by opening a transaction, creating a new version of the persistent object, and closing the transaction; and revert to its previous version by opening a transaction, destroying the current version of the object, using the previous version of the object to create a new version of the object, and ending the transaction.

Persistent Objects

New persistent objects may be created by new synthetic objects, just after the synthetic objects are created. Typically, persistent objects have little behavior associated with them other than operations for getting and setting attributes.

ORA

When started, ORA will register itself with the synthetic test program object's event supplier, instantiate event consumer and event supplier objects, and open a transaction, fetch each test object for the test program from the database, convert the test object to a C structure, map it into the loaded test program, and close the transaction.

When it receives an "object created" event, ORA will add the object ID to its list of test program objects, fetch the contents of the object, convert it to a C structure, and map it into the loaded test program.

When it receives an "object deleted" event, ORA will remove the object from its list of test program objects and from the loaded test program.

When it receives a "modify" event, ORA will fetch the contents of the object, convert it to a C structure, and map it into the loaded test program.

When it receives an "execute" event, ORA will begin execution of the appropriate object.

When it receives a "block updated" event from runtime, ORA will create or update (as appropriate) the corresponding test object with the new information.

When it receives execution events for Flow Tool, indicating, for example, the progress of test program execution, ORA will send an appropriate event to the corresponding synthetic flow tool object.

Event Consumers

Event consumers are created for the individual tools when the tools are started by VITAL. There is one event consumer for each tool. The event consumer saves the object reference to the synthetic object (model) to be used for registration. It also accepts a registration from a view by adding the view to a list of views to be notified about a specific event, and, if this is the first view to express interest in this event type, registers with the event supplier to receive notification for the appropriate event type.

An event consumer responds to a notification from an event supplier by notifying each view registered for the event that the event has occurred.

View Library

View Library (VL) provides a class library of graphical user interface (GUI) objects for building TPA applications. VL encapsulates as true C++ classes Motif widgets. This facilitates the creation of domain-specific view objects which make it possible to build GUI tools with very little additional code.

VL is based on Motif, Xt, and X elements, using the View.h++ class library from Rogue Wave Software. (Descriptions of these elements may be found in X Window System Manual Set, O'Reilly & Associates, Inc., and View.h++ Class Library, Version 1.2, Rogue Wave Software.) Other sets of GUI tools would also be suitable.

Visual Integrated Test Application Library

The Visual Integrated Test Application Library (VITAL) provides a framework for use by all TPA GUI tools. This framework enforces a standard interface style and provides common tool functionality such as "object", "edit", and "help" pulldown menus, invoking child tools, and so on. VITAL is layered on top of VL. The tester-specific interface features of TPA are provided by VITAL, which ties together a view object in a tool with the corresponding object in POEM. When the user changes one, the other is updated automatically.

VITAL is a library that implements an application framework by providing a "Vital" class. This class provides the common tool functionality and each individual tool will be a subclass from this. In this way, most common tester behavior is captured in the overall framework.

VITAL forms part of the model-view-controller triad. The view is implemented by a View Library object, the model is implemented by a synthetic test object, and VITAL provides the controller. Whenever the user changes a view (by typing into a field for example), VITAL will call a method of the corresponding synthetic object to update the corresponding data there. If the model is changed by something external to the tool, the event library will inform the controller, which will then fetch the latest data and update the view.

In order to create an MVC for a VL and a synthetic object, the tool must attach the two of them together. However, because synthetic object data is not accessed directly but is done instead through methods, in most cases four items of information are required to attach a view object to a synthetic object: (1) the view object; (2) the synthetic object; (3) the synthetic object's "set" method; and (4) the synthetic object's "get" method.

A view object is an instance of a VL class. For some view objects, such as push buttons, only one method will be required (the method to call when the button is pressed). For those with known pre-defined methods, attach does not need them specified at all.

Attach installs callback methods on the view object so that VITAL can be informed when the user makes changes. VITAL also interfaces with the event manager so that VITAL knows when the data changes. The Vital class also provides access to the event consumer for tools which need extra event consumer facilities. For example, in a tool which has a view object to accept the name of a timing object, the user begins by entering text into the timing field. When return is pressed, the callback installed by attach is invoked.

Callback then calls the specified method ("setTiming") which transfers the data by ORB to the TPAFtest object in POEM. Similarly, if another tool changes the data, the event library notifies VITAL which will get the new value and update the tool.

VITAL provides a database manager (DBM) which allows users to select objects in POEM.

All VITAL "attach" methods follow a similar format:

view->attach(<view object pointer>, <synthetic object get method>, <synthetic object set method>, <synthetic object>);

This will attach the view object to the specified synthetic object using the specified synthetic object methods.

For example, to attach a VLEngEdit object, which is an object for editing quantities expressed in engineering notation, to an attribute of a TPAGeneric object (accessible using get/set methods) the tool would call a function similar to:

view->attach(VLEngEdit *, char *set_method, char *get_method, TPAGeneric **)

The get/set methods are actually virtual C++ methods of the synthetic object. Because virtual methods cannot be called indirectly though a method pointer, the tool cannot pass them directly into attach. Instead, ORB's dynamic invocation interface (DII, part of the CORBA standard) is used, and so the name of the methods are passed into attach. Also, because some VITAL attach methods can change the synthetic object being pointed at during program execution, a double pointer to the synthetic object must be passed in.

Consider the following example IDL definition for a synthetic object called TPAFtest, written CORBA IDL:

```
interface TPAFtest : TPAGeneric
{
...
void setTiming(in string name);
string getTiming();
...
};
```

This FTest interface contains methods for setting and getting the timing to be used in the ftest. Ftest Tool will contain an object reference to an ftest synthetic object which maps to a C++ pointer to a local instance of an ftest:

TPAFtest *ftest;

The GUI of Ftest Tool in turn will contain a view object of type VLBlockEntry, as follows:

VLBlockEntry *timing=new;

VLBlockEntry(work_area, "timing", TIMING);

All of these can then be tied together by calling this VITAL attach method:

view->attach(timing, "setTiming", "getTiming", &ftest)

User Interaction Scenario

In order to explain the architecture further, the following sequence of user actions and system responses will be described.

User Action
  User starts ControlTool.
System Response
  System displays ControlTool.
  ControlTool "attaches" to a POEM.
User Action
  User picks "Select <a test program>".

System Response
  ControlTool starts SelectionTool (which is essentially a selection list).
  SelectionTool sends a getAllTPNames message to POEM.
  POEM begins a transaction.
  POEM locates the root of the database.
  POEM gets a collection of test program names.
  POEM ends the transaction.
  getAllTPNames returns the collection of test program names to SelectionTool.
  Selectiontool presents the list of test programs to the user.
User Action
  User selects a test program.
System Response
  SelectionTool returns name of selected test program to ControlTool.
  SelectionTool closes.
  ControlTool sends a selectTestProgram message to POEM.
  In POEM, selectTestProgram creates a new synthetic test program object in memory and passes it the name of the test program.
User Action
  User loads previously selected test program.
System Response
  ControlTool loads the test program, which in turn starts ORA.
  When started, ORA registers with the synthetic test program object as a view that is interested in being notified of changes, then returns a completion status to selectTestProgram in POEM.
  The synthetic test program object then begins a transaction, locates the persistent test program object and loads all data for the persistent test program. It also creates a synthetic object for every object in the test program. For each object created, ORA is notified that the object has been created. Upon receipt of this notification, ORA registers itself with the object to be notified of updates. Each synthetic object initializes itself from its persistent counterpart. ORA is notified of all updates. Each time ORA receives notification of an update from an object, it notes (internally) that the synthetic object does not match the object in the loaded test program, so that the contents of the object can be fetched before the test program is executed.
  After all synthetic objects have been loaded, the test program ends the transaction and returns to selectTestProgram.
  selectTestProgram returns the object reference of the synthetic test program object to ControlTool
User Action
  User invokes "blank" Ftest tool.
System Response
  ControlTool starts FtestTool and passes the object reference to the synthetic test program.
User Action
  User selects "New <ftest>".
System Response
  FtestTool sends an okToModify message to the test program and, for example, receives a "yes" answer.
  FtestTool sends a newFtest message to the synthetic test program object.
  The synthetic test program object creates a new synthetic ftest object, which creates a new persistent ftest object. The synthetic test program object notifies ORA that a new Ftest has been created and sends ORA the object reference of the new synthetic ftest. ORA registers with the new Ftest for update notification. The synthetic test program object returns the object reference of the new synthetic ftest to FtestTool.

User Action

User enters information to define a new Ftest.

System Response

As each field is entered, the appropriate method in the synthetic object is invoked to update the object. Each method also updates the persistent Ftest object. It also sends an event to ORA to notify it that the Ftest has been modified.

User Action

User selects "save" in Ftest.

System Response

FtestTool sends a save message to the synthetic object.

The synthetic Ftest object begins a transaction, creates a new version of the persistent Ftest object and ends the transaction.

User Action

User quits ControlTool.

System Response

ControlTool destroys the synthetic test program object which, in turn, destroys all component synthetic objects.

ControlTool unloads the loaded test program.

ControlTool notifies POEM that it is exiting.

The present invention has been described in terms of specific embodiments. The invention, however, is not limited to these specific embodiments. Rather, the scope of the invention is defined by the following claims, and other embodiments are within the scope of the claims.

What is claimed is:

1. A test programming architecture providing a programming framework for a programmable tester for testing circuits, comprising:

a database for storing test program elements embodying test program logic for testing a circuit;

one or more tools, each having a view object for interacting with a user;

an environment manager operable to cause test program elements to be read from the database, to cause test program elements to be loaded in a memory of the tester for execution, and to maintain a model of the test program loaded in a tester; and an object request broker providing communication among view objects in tools, the model of the test program maintained by the environment manager, and the test program loaded in the memory of the tester.

2. The architecture of claim 1, further comprising:

an object runtime adapter module executable in the tester to provide interface services between the environment manager and a test program loaded in the tester, where the adapter module has an interface for invocation through the object request broker and where the adapter module is executable to appear as a view to the environment manager; and a legacy interface module executable in the tester to provide interface services outside the object request broker between legacy tools and a test program loaded in the tester.

3. The architecture of claim 2 wherein the database is an object database and wherein the adapter module is configured to access the database directly.

4. The architecture of claim 1 wherein:

the environment manager is a daemon process;

the test program elements in the database comprise persistent test objects encapsulating test program behavior; and the environment manager creates synthetic test objects from persistent test objects in the database.

5. The architecture of claim 1, wherein the tools communicate with test program elements by communicating through the object request broker with copies of test program elements created in a transient memory area belonging to the environment manager.

6. A system for the development and execution of test programs for testing circuits, comprising:

a programmable tester for testing circuits, the tester including a test program memory and an embedded processor, the processor being operable to perform data management and control functions for the tester and to run a test program comprising test program elements loaded in the memory to test a circuit;

a first computer distinct from the embedded processor and coupled to the tester for data communication;

one or more user interface tools configured to run on the first computer for use by a user, the tools providing views to the user of the test program loaded in the memory;

a second computer distinct from the embedded processor and coupled for data communication to the tester and to a database of test program elements, the second computer being programmed to provide test program elements to the tester for loading into the memory for execution; and a data synchronization broker operable to run on the embedded computer, the first computer, and the second computer, the broker providing communication among the tools and the test program loaded in the memory, the broker further providing data synchronization between tools and test program elements.

7. The system of claim 6 further comprising:

a data path directly coupling the tester to a database; and a data interface module programming the tester for loading test program elements from the database through the data path.

8. The system of claim 6 further comprising a legacy interface executable in the tester to provide interface services directly between legacy tools and a test program loaded in the tester.

9. The system of claim 6 further comprising:

an environment manager configured to run on a third computer, the environment manager being operable to read test program elements from the database of test program elements, to cause test program elements to be loaded in a memory of the tester for execution, and to maintain a model of the test program loaded in a tester, wherein the broker is operable to provide data synchronization between tools and the model of the test program loaded in the tester; and a runtime view module running on the embedded processor and appearing as a view to the environment manager.

10. The system of claim 6 wherein the first computer is distinct from the second computer and coupled to the second computer by a network.

11. The system of claim 6 where the database is served by a database server separate from the second computer.

12. A programmable architecture for a programmable tester for testing circuits, the tester having memory for storing test programs for execution, comprising:

a database for storing test program elements embodying test program logic for testing a circuit;

one or more user interface tools configured to run on a first computer external to the tester for use by a user, each tool providing a view to the user of the test program loaded in the memory, each tool having an event consumer for receiving events;

a runtime adapter module executable in the tester to provide interface services between the tools and the test program loaded in the tester, the adapter module having an event supplier and an event consumer;

the adapter module event consumer being operable to receive events from the test program, including a change event indicating a change in the test program, and to receive events from the user interface tools, including an execute event directing that a test program element be executed;

the adapter module being operable to cause a test program element to be executed in response to receipt of an execute event from a user interface tool;

the adapter module event supplier being operable to send events to the event consumers of the user interface tools, including an execution done event, indicating that execution of a test program element has completed; and an object request broker providing data communication among user interface tools, the database, and the test program loaded in the memory of the tester.

13. The architecture of claim 12, further comprising:

a legacy interface module executable in the tester to provide interface services outside the object request broker between legacy tools and the test program loaded in the tester.

14. The architecture of claim 12, further comprising:

an environment manager operable as a daemon process to cause test program elements to be read from the database, to cause test program elements to be loaded in a memory of the tester for execution, and to maintain a model of the test program loaded in a tester by creating synthetic test objects from persistent test objects in the database.

15. A circuit tester system, comprising:

a circuit tester having a memory, the tester being operable to execute test programs loaded in the memory to test a circuit;

a set of user tools operable to allow a user to interact with the circuit tester or with a test program loaded in the memory;

a runtime module configured to be loaded into the memory to provide an interface between test programs loaded in the tester and tester hardware; and an environment manager operable to maintain a model of the state of a test program stored in the circuit tester memory;

the user tools, runtime module, and environment manager forming a model-view-controller architecture providing:

user interface views in the user tools, runtime views in the runtime module, model functionality in the environment manager linking user interface views and runtime views to elements of the test program loaded in the memory, controller functionality in user tools and runtime modules, and communication among user interface views, the model maintained by the environment manager, and the test program loaded in the memory.

16. The system of claim 15, further comprising:

an object request broker providing the communication among user interface views, the model maintained by the environment manager, and the test program in the model-view-controller architecture.

17. The system of claim 15, wherein:

the runtime module provides a runtime view operable to transform the state of the model into hardware executable data.

18. The system of claim 15, wherein the set of tools includes:

a tool allowing the user to select test program elements from a test program database to be loaded in the circuit test memory; and a tool allowing the user to specify a sequence of tests.

19. The system of claim 15, wherein the set of tools includes:

a tool allowing the user to select timing and vector patterns for a functional test of a circuit.

20. The system of claim 15, further comprising:

an adapter module executable in the tester to provide interface services between the environment manager and the test program loaded in the tester, the adapter module having an interface for invocation through the object request broker and being executable to appear as a view to the environment manager.

21. The system of claim 15, further comprising:

a legacy interface module configured to be loaded into the memory of the tester to provide interface services between legacy tools and the test program loaded in the memory directly and without use of the object request broker.

22. The system of claim 15, further comprising a database of test program elements, wherein:

the runtime module is coupled to the database to provide direct communication of test program elements from the database to the memory.

23. The system of claim 15, wherein:

the environment manager is a daemon process that stores in a transient memory copies of test program elements loaded in the tester.

24. A programmable circuit tester system, comprising:

a circuit tester having a memory, the tester being operable to execute test programs loaded in the memory to test a circuit;

a database for storing test program elements embodying test program logic for testing a circuit; and a set of cooperating computer program modules operable to:

allow a user to select test program elements to be loaded in the memory of the tester, read test program elements from the database, cause test program elements to be loaded in the memory of the tester, maintain a model of the test program loaded in a tester, and detect when changes are made to the test program loaded in a tester and in response propagate to the database changes made to the test program loaded in a tester.

25. The system of claim 24, wherein the cooperating computer program modules are further operable to:

allow the user to change the model of the test program loaded in a tester and in response to make a corresponding change to the test program loaded in a tester.

26. The system of claim 24, wherein the cooperating computer program modules are further operable to:

allow the user to change an element of the test program loaded in a tester and to write out a source code file of the changed element.

27. The system of claim 24, wherein when a test program element is changed by the test program itself or by a user action, the change is propagated to the model.

* * * * *